United States Patent [19]
Weiblen et al.

[11] Patent Number: 5,547,730
[45] Date of Patent: Aug. 20, 1996

[54] DEVICE HAVING A MOUNTING BOARD AND METHOD FOR APPLYING A PASSIVATING GEL

[75] Inventors: Kurt Weiblen, Metzingen; Bertram Woessner, Beerwalde, both of Germany

[73] Assignee: Robert Bosch GmbH, Stuttgart, Germany

[21] Appl. No.: 376,515

[22] Filed: Jan. 23, 1995

[30]     Foreign Application Priority Data

Feb. 25, 1994 [DE]  Germany .......................... 44 05 710.5

[51] Int. Cl.⁶ .............................. H01L 23/29; H01L 23/31
[52] U.S. Cl. ......................... 428/76; 174/52.2; 257/790; 437/211
[58] Field of Search ...................... 428/68, 76; 174/52.2; 257/790; 437/211

[56]         References Cited

U.S. PATENT DOCUMENTS

| 3,885,304 | 5/1975 | Kaiser et al. ............................. 29/627 |
| 5,336,931 | 8/1994 | Juskey et al. .......................... 174/52.2 |
| 5,399,805 | 3/1995 | Tyler et al. ............................. 174/52.2 |

FOREIGN PATENT DOCUMENTS 2214163  3/1972  Germany .

*Primary Examiner*—Alexander S. Thomas
*Attorney, Agent, or Firm*—Kenyon & Kenyon

[57]           ABSTRACT

In a device and a method for passivating components, a thixotropic gel is arranged in the shape of a ring around a component. The inside space surrounded by the thixotropic gel is filled with a passivating gel until the component is completely covered with passivating gel. The gels are subsequently hardened.

7 Claims, 2 Drawing Sheets

DEVICE HAVING A MOUNTING BOARD AND METHOD FOR APPLYING A PASSIVATING GEL

FIELD OF THE INVENTION

The present invention relates to a device having a mounting board, on which a passivated component is arranged, and to a method for applying a passivating gel.

BACKGROUND INFORMATION

German laid open Patent No. 22 14 163 discusses a device which has a mounting board, an electric component being arranged on the mounting board. The electric component is supplied with voltage via supply leads. The supply leads and the electric component are protected from external influences and damage by a hardened passivating gel acting as a protective layer.

In a first variant, the protective layer surrounds the electric component and the supply leads. Since the passivating gel is applied in a liquid state to the electric component, it is not possible in this case to cover precisely-defined surfaces with the protective layer, since the passivating gel flows apart (thins out) before hardening. Another arrangement consists in placing a frame around an electric component having supply leads and subsequently filling up the frame with the passivating gel, which forms the protective layer. In so doing, leakage can occur between the mounting board and the frame, so that passivating gel flows through between the mounting board and the frame and covers areas of the mounting board that had not been anticipated.

It is also known to arrange a frame around an electric component and to tightly bond the entire frame to the mounting board. Adhering the entire frame to the mounting board requires a high level of accuracy for the adjustment of the adhesive agent or the frame and is, therefore, relatively costly.

SUMMARY OF THE INVENTION

The arrangement according to the present invention has the advantage that any desired forms of flow arresters (obstructions) can be arranged with the help of thixotropic gel, and that the passivating gel is reliably bounded by the thixotropic gel. This renders possible a simple, cost-effective, and rapid passivation of components.

One especially advantageous further development relates to placing a frame around a component and filling up the space between the mounting board and the frame with a thixotropic gel and sealing it off. Thus, the costly step of imperviously bonding the entire frame to the mounting board can be avoided. In addition, thixotropic gels exhibit flow properties, which securely seal off the interspaces between a frame and a mounting board.

It is especially advantageous to fix the frame to the mounting board using a point-to-point, spot-applied adhesive layer. This provides greater accuracy for mounting the frame and prevents it from slipping, and does not necessitate bonding the entire frame to the mounting board. In comparison, the advantage of the method according to the present invention is that there is no need for a precise adjustment of the frame on the mounting board or on the adhesive layer. Furthermore, the passivating gel and the thixotropic gel can be applied advantageously, one after the other without a drying operation. This shortens the manufacturing process and renders the device more cost-effective.

A further improvement in the method relates to arranging the frame over another component. In this manner, only selected parts of a component are protected by passivating gel, so that one can economize on passivating gel and shorten the process.

DETAILED DESCRIPTION

Figure 1:
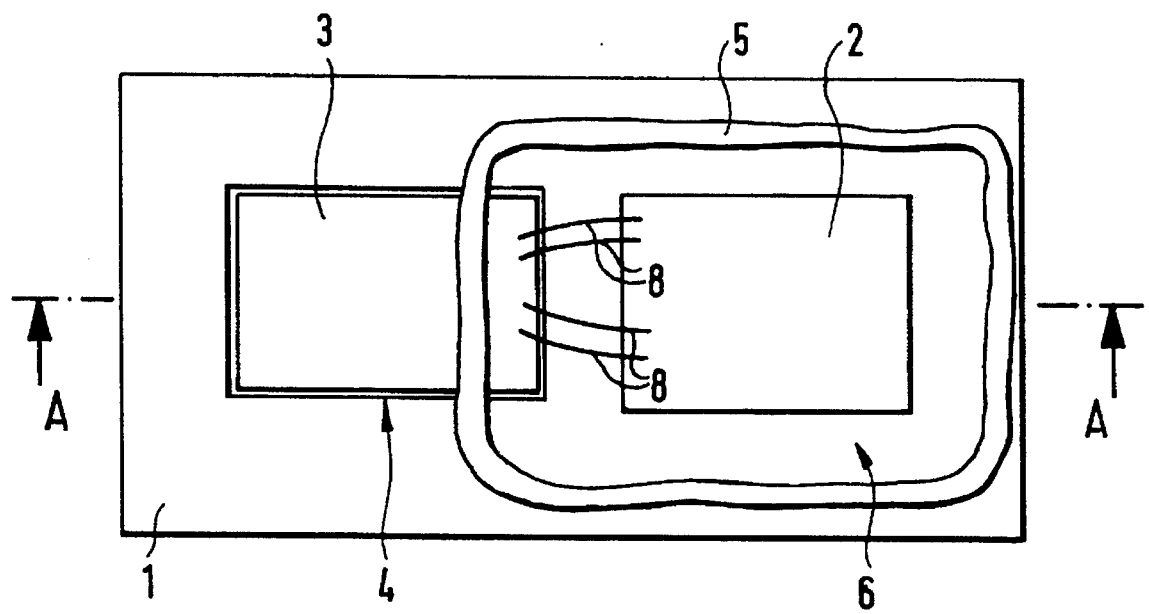
FIG. 1 shows a flow arrester of thixotropic gel, according to the present invention.

FIG. 1 depicts a mounting board 1, which has a cutout 4. Another component 3, which is designed in this exemplary embodiment as a chip having an integrated circuit, is introduced into the cutout 4. The mounting board 1 is preferably made of aluminum. Other materials suited for manufacturing the mounting board are, for example, copper and plastics. A component 2 is arranged next to the cutout 4 on the mounting board 1. The component may be a hybrid circuit. The component 2 and the other component 3 are electrically interconnected via lines 8. The component 2 is surrounded by a closed flow arrester 5 of thixotropic gel. The flow arrester 5 is routed (set down) at right angles across the other component 3, so that one section of the other component 3, the lines 8, and the component 2 are surrounded by the flow arrester 5. A passivating gel 6 is arranged inside the flow arrester 5 as a protective layer against environmental. One section of the other component 3, the lines 8, and the component 2 are covered by the passivating gel 6.

Figure 2:
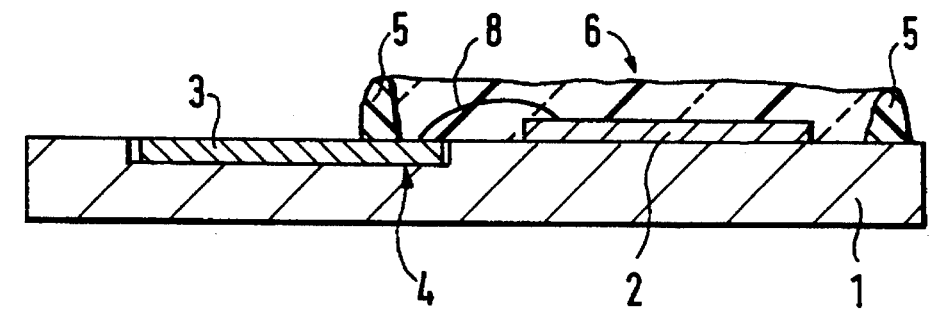
FIG. 2 shows the flow arrester of FIG. 1 in cross-section.

FIG. 2 depicts the flow arrester of FIG. 1 along the line A—A. The cutout 4 in the mounting board 1, in which the other component 3 is inserted, is clearly discernable. The cross-section shows the bulb-like shape of the flow arrester 5, which is formed of thixotropic gel. The flow arrester 5 is arranged on the mounting board 1 and on the other component 3. The section of the other component 3, from which the lines 8 are routed to the component 2, is situated inside the flow arrester 5. The space inside the flow arrester 5 is filled up with passivating gel 6. The standard gel Q3 6527 may be used as passivating gel, and Semicosil 900 LT from Wacker as thixotropic gel, for example. However, other passivating gels and other thixotropic gels can also be used.

The arrangement according to FIGS. 1 and 2 functions as follows: With the help of a thixotropic gel, a flow arrester 5 is placed around a component 2, which is designed as a hybrid component. The thixotropic gel is applied as a closed ring, in the shape of a bulb, around the component 2. The thixotropic gel, as shown in FIG. 1, can also be routed over another component 3. Thixotropic gels have the property of liquefying when subjected to deformation, and of changing into a solid state when not subjected to deformation. In addition, thixotropic gels can also be hardened through heat treatment.

Moreover, thixotropic gels are not chemically aggressive, so that they can be arranged on additional components 3 having integrated circuits or hybrid circuits, for example, without damaging the integrated circuits or the hybrid circuits. In addition, when passivating gels are used, there is no potential for poisoning phenomena, i.e., when the passivating gel and the thixotropic gel come in contact with one another, they do not mix and their chemical and mechanical properties are not affected. It is thus possible, in accordance with FIG. 1, to arrange a thixotropic gel as a flow arrester 5 and to apply a passivating gel 6 to the surface bounded by the flow arrester 5. The passivating gel 6 is prevented from flowing apart by the flow arrester 5, and it fills up the space inside the ring formed by the flow arrester 5. The thixotropic gel and the passivating gel are subsequently hardened at a temperature of 180° for a duration of 2½ hours. In this manner, a passivation of the component 2 and the additional component 3 is achieved, which protects against environmental influences, such as moisture.

Figure 3:
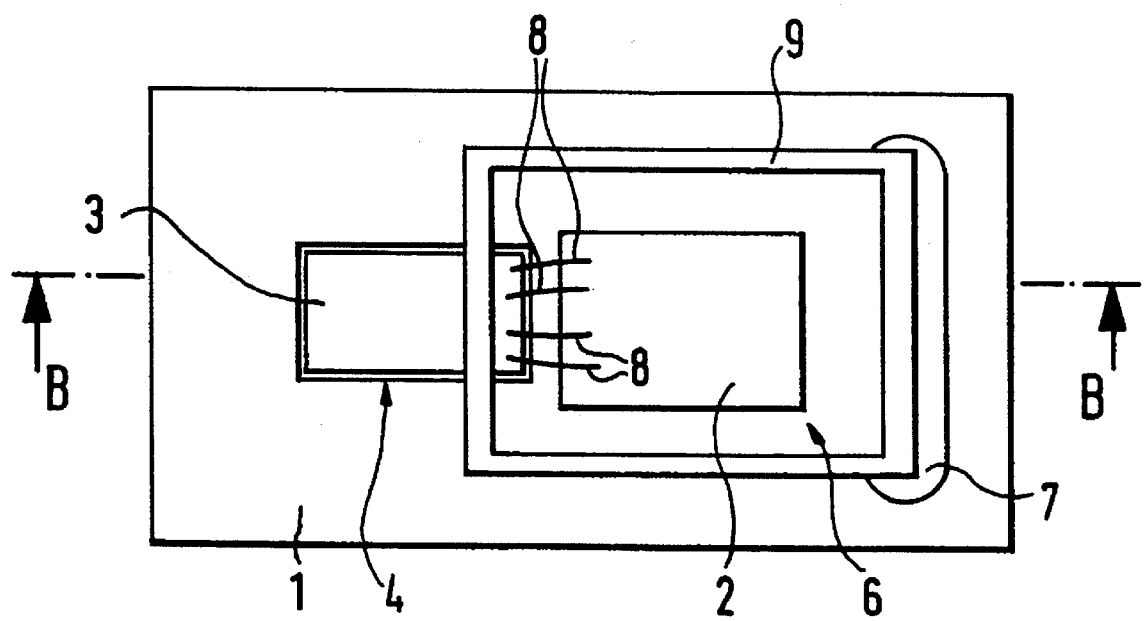
FIG. 3 shows a flow arrester comprised of a frame and thixotropic gel, according to the present invention.

FIG. 3 depicts a mounting board 1 having a cutout 4. Inserted in the cutout 4 is the additional component 3. Besides the additional component 3, the component 2 is arranged on the mounting board 1. The component 2 and the additional component 3 are electrically interconnected via lines 8. A frame 9 made of plastic is mounted on the mounting board 1 so as to bound that section of the additional component 3, from which the lines 8 emanate, and the component 2. The frame 9 has a rectangular shape, one lateral side being placed over the other component 3. The other lateral side is bonded to the mounting board 1 by means of a spot-applied adhesive layer 7. The inner rims of the frame 9, which rest on the mounting board 1 or the other component 3, are filled up all around with thixotropic gel 5. In this manner, spaces between the frame 9 and the mounting board 1, or between the frame 9 and the other component 3, are filled up with thixotropic gel 5 and sealed off. Now, if a passivating gel 6 is poured into the frame 9, it cannot flow through between the frame 9 and the mounting plate 1 or the other component 3.

Figure 4:
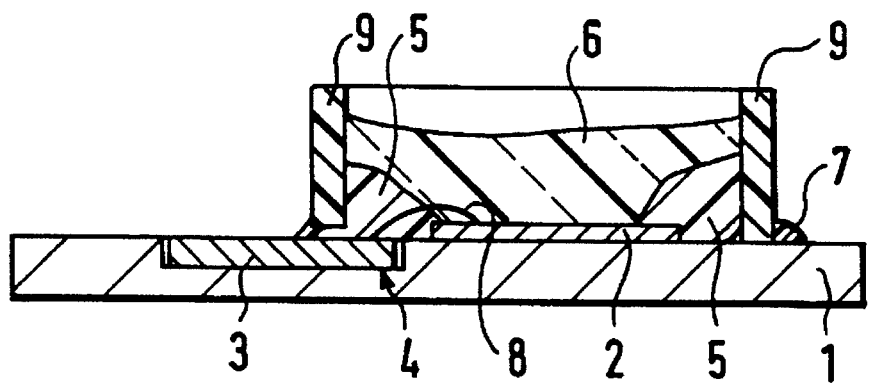
FIG. 4 shows a section through the protective layer of FIG. 3.

FIG. 4 depicts a cross-section of FIG. 3 along the line B—B. The cutout 4, in which the additional component 3 is inserted, is clearly discernable in the mounting board 1. Besides the additional component 3, the component 2 is arranged on the mounting board 1. The component 2 is linked via lines 8 to the other component 3. The frame 9 is placed on the mounting board 1, the frame 9 being bonded on one lateral side by means of a point-to-point adhesive 7 to the mounting board 1. The corners formed by the mounting board 1 or the other component 3 and the frame 9 are filled up with thixotropic gel 5. This seals off the frame 9 from the mounting board 1, or from the other component 3. The thixotropic gel 5 flows under the frame 9. A passivating gel 6 is subsequently poured into the space delimited by the frame 9 until the lines 8 and the component 2 are completely covered.

The arrangement shown in FIGS. 3 and 4 is produced with the following method. The frame 9 is placed on the mounting board 1, on which the additional component 3 and the component 2 are arranged, (a relatively small area of) the frame 9 being securely joined at the same time by means of the spot-type adhesive layer 7 to the mounting board 1. This fixes the position of the frame 9 on the mounting board 1.

Thixotropic gel 5 is subsequently poured into the corners, which are formed between the frame 9 and the mounting board 1, or between the frame 9 and the other component 3. Simicosil 900 LT gel from Wacker is used as thixotropic gel 5. The thixotropic gel 5 flows into the interspaces between the mounting board 1 and the frame 9, or between the other component 3 and the frame 3 and, thus, seals off the interspaces. The passivating gel 6 (Q3 6527) is subsequently poured into the frame 9 without hardening. The thixotropic gel 5 and the passivating gel 6 are then hardened at a temperature of 180° for a duration of 2½ hours.

By applying this simple method, a cost-effective passivation of components is achieved. Since it is not necessary to harden the thixotropic gel before pouring in the passivating gel, the manufacturing time is shortened. With the help of the thixotropic gel, gap widths of about 10 to $300 \times 10^{-6}$ m are reliably sealed off. The thixotropic gel is poured into the corner areas using a cannula having a diameter of about 0.65 mm. The behavior of the thixotropic gel and the passivating gel with respect to one another is chemically stable. No changes occur in the chemical or mechanical properties of the gels.

What is claimed is:

1. A device comprising:

a mounting board;

a component arranged on the mounting board;

a passivating gel covering the component, the passivating gel having a plurality of sides; and a flow arrester bounding at least one of the sides of the passivating gel, the flow arrester including a thixotropic gel.

2. The device according to claim 1, wherein the passivating gel functions as a protective layer.

3. The device according to claim 1, wherein the flow arrester bounds the plurality of sides of the passivating gel.

4. A device comprising:

a mounting board;

a component arranged on the mounting board;

a passivating gel covering the component, the passivating gel having a plurality of sides; and a flow arrester bounding at least one of the sides of the passivating gel, the flow arrester including a thixotropic gel and a frame.

5. The device according to claim 4, wherein the thixotropic gel is disposed between the frame and the mounting board as a sealant.

6. The device according to claim 4, wherein the thixotropic gel is disposed between the frame and the component as a sealant.

7. The device according to claim 4, further comprising a spot-type adhesive layer fixing the frame to the mounting board.

* * * * *